United States Patent
Li et al.

(10) Patent No.: US 8,421,228 B2
(45) Date of Patent: *Apr. 16, 2013

(54) STRUCTURE AND METHODS OF FORMING CONTACT STRUCTURES

(75) Inventors: Ying Li, Newburgh, NY (US); Keith Kwong Hon Wong, Wappingers Falls, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/405,443

(22) Filed: Feb. 27, 2012

(65) Prior Publication Data

US 2012/0153482 A1    Jun. 21, 2012

Related U.S. Application Data

(63) Continuation of application No. 11/870,551, filed on Oct. 11, 2007, now Pat. No. 8,183,145.

(51) Int. Cl.
*H01L 23/48* (2006.01)
*H01L 23/52* (2006.01)
*H01L 29/40* (2006.01)

(52) U.S. Cl.
USPC ........... 257/754; 438/618; 438/642; 438/652; 438/734; 438/742; 257/750; 257/751

(58) Field of Classification Search .............. None
See application file for complete search history.

(56) References Cited

U.S. PATENT DOCUMENTS

| 5,328,873 | A | | 7/1994 | Mikoshiba et al. |
| 5,486,492 | A | | 1/1996 | Yamamoto et al. |
| 5,736,458 | A | | 4/1998 | Teng |
| 5,990,020 | A | * | 11/1999 | Ha .................................. 438/738 |
| 5,994,211 | A | | 11/1999 | Wang et al. |
| 6,177,347 | B1 | | 1/2001 | Liu et al. |
| 6,376,355 | B1 | * | 4/2002 | Yoon et al. ...................... 438/618 |
| 6,391,769 | B1 | * | 5/2002 | Lee et al. ....................... 438/643 |

(Continued)

OTHER PUBLICATIONS

Sung Ho Han et al.; Advanced Al Damascene Process for Fine Trench under 70nm Design Rule; Mater. Res. Soc. Symp. Proc. vol. 863 © 2005 Materials Research Society; pp. B8.23.1-B8.23-6.

(Continued)

*Primary Examiner* — Julio J Maldonado
*Assistant Examiner* — Shantanu C Pathak
(74) *Attorney, Agent, or Firm* — Schmeiser, Olsen & Watts; Ian D. MacKinnon

(57) ABSTRACT

A contact structure and a method of forming the contact structure. The structure includes: a silicide layer on and in direct physical contact with a top substrate surface of a substrate; an electrically insulating layer on the substrate; and an aluminum plug within the insulating layer. The aluminum plug has a thickness not exceeding 25 nanometers in a direction perpendicular to the top substrate surface. The aluminum plug extends from a top surface of the silicide layer to a top surface of the insulating layer. The aluminum plug is in direct physical contact with the top surface of the silicide layer and is in direct physical contact with the silicide layer. The method includes: forming the silicide layer on and in direct physical contact with the top substrate surface of the substrate; forming the electrically insulating layer on the substrate; and forming the aluminum plug within the insulating layer.

20 Claims, 4 Drawing Sheets

U.S. PATENT DOCUMENTS

| | | | |
|---|---|---|---|
| 6,503,803 | B2 | 1/2003 | Todorobaru et al. |
| 6,794,752 | B2 | 9/2004 | Lee et al. |
| 6,887,782 | B2 | 5/2005 | Bell et al. |
| 6,969,671 | B2 | 11/2005 | Shimazu et al. |
| 7,057,285 | B2 | 6/2006 | Lee et al. |
| 2004/0018714 | A1 | 1/2004 | Cooney et al. |
| 2005/0161827 | A1 | 7/2005 | Andideh et al. |
| 2005/0179141 | A1 | 8/2005 | Yun et al. |
| 2006/0157750 | A1 | 7/2006 | Kim et al. |
| 2009/0096108 | A1 | 4/2009 | Li et al. |
| 2010/0193953 | A1* | 8/2010 | Amano et al. ............... 257/751 |

OTHER PUBLICATIONS

Office Action (Mail Date Dec. 9, 2009) for U.S. Appl. No. 11/870,551, filed Oct. 11, 2007; Confirmation No. 5111.
Amendment filed Mar. 8, 2010 in response to Office Action (Mail Date Dec. 9, 2009) for U.S. Appl. No. 11/870,551, filed Oct. 11, 2007; Confirmation No. 5111.
Final Office Action (Mail Date May 17, 2010) for U.S. Appl. No. 11/870,551, filed Oct. 11, 2007; Confirmation No. 5111.
Amendment after Final filed Jul. 19, 2010 in response to Final Office Action (Mail Date May 17, 2010) for U.S. Appl. No. 11/870,551, filed Oct. 11, 2007; Confirmation No. 5111.
Request for Continued Examination filed Aug. 16, 2010 for U.S. Appl. No. 11/870,551, filed Oct. 11, 2007; Confirmation No. 5111.
Office Action (Mail Date Sep. 21, 2010) for U.S. Appl. No. 11/870,551, filed Oct. 11, 2007; Confirmation No. 5111.
Amendment filed Dec. 20, 2010 in response to Office Action (Mail Date Sep. 21, 2010) for U.S. Appl. No. 11/870,551, filed Oct. 11, 2007; Confirmation No. 5111.
Office Action (Mail Date Mar. 16, 2011) for U.S. Appl. No. 11/870,551, filed Oct. 11, 2007; Confirmation No. 5111.
Amendment filed Jun. 8, 2011 in response to Office Action (Mail Date Mar. 16, 2011) for U.S. Appl. No. 11/870,551, filed Oct. 11, 2007; Confirmation No. 5111.
Final Office Action (Mail Date Jul. 8, 2011) for U.S. Appl. No. 11/870,551, filed Oct. 11, 2007; Confirmation No. 5111.
Amendment After Final filed Sep. 7, 2011 in response to Final Office Action (Mail Date Jul. 8, 2011) for U.S. Appl. No. 11/870,551, filed Oct. 11, 2007; Confirmation No. 5111.
Advisory Action (Mail Date Sep. 21, 2011) for U.S. Appl. No. 11/870,551, filed Oct. 11, 2007; Confirmation No. 5111.
Notice of Appeal and Pre-Brief Conference Request filed Oct. 11, 2011 for U.S. Appl. No. 11/870,551, filed Oct. 11, 2007; Confirmation No. 5111.
Pre-Brief Appeal Conference Decision (Mail Date Nov. 4, 2011) for U.S. Appl. No. 11/870,551, filed Oct. 11, 2007; Confirmation No. 5111.
Notice of Allowance (Mail Date Jan. 20, 2012) for U.S. Appl. No. 11/870,551, filed Oct. 11, 2007; Confirmation No. 5111.
Wolf et al.; Silicon Processing for the VLSI Era; vol. 1; Process Technology; Sunset Beach, Lattice 2000; pp. 216-219.

* cited by examiner

STRUCTURE AND METHODS OF FORMING CONTACT STRUCTURES

This application is a continuation application claiming priority to Ser. No. 11/870,551, filed Oct. 11, 2007, now U.S. Pat. No. 8,183,145, issued May 22, 2012.

FIELD OF THE INVENTION

The invention relates to material compositions and methods for forming metal contacts in semiconductor materials.

BACKGROUND OF THE INVENTION

As via sizes in semiconductor manufacturing reduces in scale with the technology node, the demand for smaller contact structures has increased. Tungsten may provide sufficient contact metallurgy down to about 45 nanometers (nm), where modeling has suggested copper may be used for the 32 nm mode since the resistively of plated copper may be significantly lower than chemical vapor deposited tungsten. However as the dimension of the via/line continues to reduce, surface and grain boundary scattering of electron and phonon in copper may significantly increase. There exists a need for a contact structure which offers reduced electrical resistance.

SUMMARY OF THE INVENTION

The present invention relates to a method of forming contact structures, comprising:

depositing a silicide layer onto a substrate, said silicide layer having a first surface;

depositing an electrically insulating layer over said first surface of said silicide layer, said insulating layer having a second surface;

forming a via through said insulating layer, said via having a bottom defined by a portion of said first surface, wherein said via extends from said second surface to said first surface, wherein said forming exposes said portion of said first surface, said via having at least one vertical wall;

depositing an electrically conductive layer onto said second surface and inside said via, wherein said conductive layer covers said bottom of said via and said at least one vertical wall of said via;

removing said conductive layer from said second surface and said bottom of said via, said conductive layer remaining on said at least one vertical wall of said via, resulting in said portion of said silicide being exposed; and filling said via with aluminum, said aluminum directly contacting said first surface of said silicide layer.

The present invention relates to a layered structure, comprising:

a silicide layer disposed on a first surface of a substrate, said silicide layer having a second surface;

an electrically insulating layer disposed over said second surface of said silicide layer, said insulating layer having a third surface;

an aluminum plug extending from said third surface through said electrically insulating layer to said second surface, wherein said plug directly contacts said silicide layer; and an electrically conductive layer disposed between said aluminum plug and said insulating layer.

The present invention relates to a method for forming a contact structure, comprising:

providing a substrate, said substrate having an electrically insulating layer disposed thereon, said electrically insulating layer having a first surface, wherein said electrically insulating layer comprises at least one trench disposed thereon and extending from said first surface to a bottom of said at least one trench, said at least one trench defined by at least one sidewall and said bottom, said bottom having a silicide layer disposed thereon;

depositing an electrically conductive layer into said at least one trench, said conductive layer adhering to said silicide layer, said at least one sidewall of said at least one trench, and said first surface;

etching selectively said electrically conductive layer from said silicide layer and said first surface; and depositing aluminum into said at least one trench, wherein responsive to said depositing, an aluminum layer grows selectively from said silicide layer and said at least one sidewall, said aluminum in direct contact with said silicide layer.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings.

DETAILED DESCRIPTION OF THE INVENTION

Figure 1A:
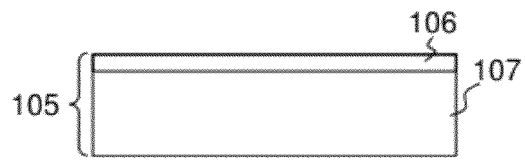
FIG. 1A is an illustration of a cross-section of a substrate 105, in accordance with embodiments of the present invention.

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as examples of embodiments. The features and advantages of the present invention are illustrated in detail in the accompanying drawings, wherein like reference numerals refer to like elements throughout the drawings. Although the drawings are intended to illustrate the present invention, the drawings are not necessarily drawn to scale.

FIG. 1A is an illustration of a cross-section of a substrate 105. The substrate 105 may comprise multiple layers such as layers 106 and 107 shown in the example illustrated in FIG. 1A, or the substrate may comprise a single layer. The substrate 105 may include a semiconducting material, an insulating material, a conductive material or any combination thereof, including multilayered structures. Thus, for example, substrate 105 may be a semiconducting material such as Si, SiGe, SiGeC, SiC, GaAs, InAs, InP and other III/V or II/VI compound semiconductors. The substrate 105 may be, for example, a silicon wafer or process wafer such as that produced in various steps of a semiconductor manufacturing process, such as an integrated semiconductor wafer. The substrate 105 may be a layered substrate such as, for example, Si/SiGe, Si/SiC, silicon-on-insulators (SOIs) or silicon germanium-on-insulators (SGOIs). The substrate 105 may comprise layers such as a dielectric layer, a barrier layer for copper such as SiC, a metal layer such as copper, a silicon layer, a silicon oxide layer, the like, or combinations thereof. The substrate 105 may comprise an insulating material such as an organic insulator, an inorganic insulator or a combination thereof including multilayers. The substrate 105 may comprise a conductive material, for example, polycrystalline silicon (polySi), an elemental metal, alloys of elemental metals, a metal silicide, a metal nitride, or combinations thereof, including multilayers. The substrate may comprise ion implanted areas, such as ion implanted source/drain areas having P-type or N-type diffusions active to the surface of the substrate.

In some embodiments, the substrate 105 may include a combination of a semiconducting material and an insulating material, a combination of a semiconducting material and a conductive material or a combination of a semiconducting material, an insulating material and a conductive material. An example of a substrate that includes a combination of the above is an interconnect structure.

Figure 1B:
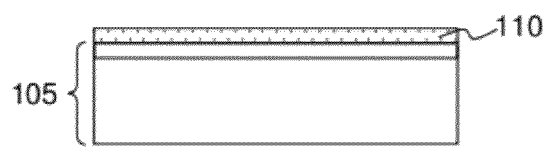
FIG. 1B is an illustration of the substrate of FIG. 1A where a silicide layer has been deposited onto a surface of the substrate, in accordance with embodiments of the present invention.

FIG. 1B is an illustration of the substrate 105 of FIG. 1A where a silicide layer 110 has been deposited onto a surface of the substrate 105. The silicide layer 110 may comprise a material such as NiPt, NiPtRe, NiSi, CoSi$_2$, YtSi, ErSi, TiSi$_2$, tungsten silicides, or combinations thereof.

Figure 1C:
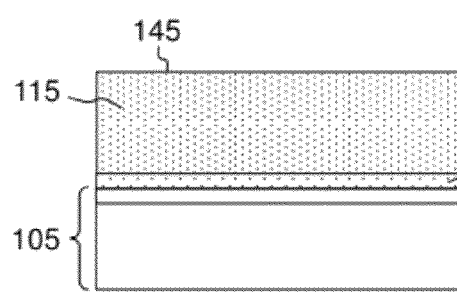
FIG. 1C is an illustration of the substrate and silicide layer of FIG. 1B where an electrically insulating layer has been deposited over the surface of the silicide layer, in accordance with embodiments of the present invention.

FIG. 1C is an illustration of the substrate 105 and silicide layer 110 of FIG. 1B where an electrically insulating layer 115 has been deposited over the surface of the silicide layer 110, where the insulating layer has a surface 145. The electrically insulating layer 115 may, for example, comprise a dielectric layer such as a carbon-doped oxide dielectric material comprising Si, C, O, and H, undoped silicate glass (USG), a stress liner such as a compressive or tensile nitride of silicon, or combinations thereof.

Figure 1D:
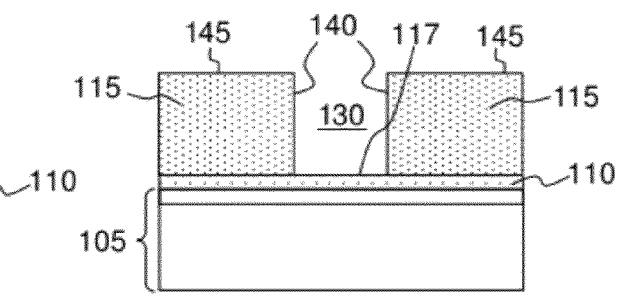
FIG. 1D is an illustration of the layers in FIG. 1C where a via has been formed through the insulating layer, in accordance with embodiments of the present invention.

FIG. 1D is an illustration of the layers in FIG. 1C where a via 130 has been formed through the insulating layer 115. The via 130 may extend from the surface 145 of the insulating layer 115 to the surface of the silicide layer 110. The via 130 may have a bottom 117 defined by an exposed portion of the surface of the silicide layer 110 and may have at least one substantially vertical wall 140. The via 130 may be formed by processes such as wet etching, dry etching, reactive ion etching, photolithography, and similar processes known to those skilled in the art.

Figure 1E:
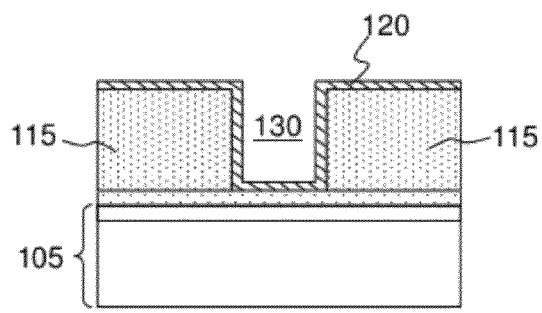
FIG. 1E is an illustration of the layered structure of FIG. 1D where an electrically conductive layer has been deposited onto the surface of the electrically insulating layer and inside the via, in accordance with embodiments of the present invention.

FIG. 1E is an illustration of the layered structure of FIG. 1D where an electrically conductive layer 120 has been deposited onto the surface 145 of the electrically insulating layer 115 and inside the via 130. The electrically conductive layer 120 may substantially cover the bottom 117 of the via 130 and substantially cover the at least one vertical sidewall 140 of the via 130.

The electrically conductive layer 120 may be deposited using processes such as atomic layer deposition (ALD), chemical vapor deposition (CVD), or a combination of these processes. The electrically conductive layer may comprise conductive materials such as titanium nitride, ruthenium, or a combination thereof.

Figure 1F:
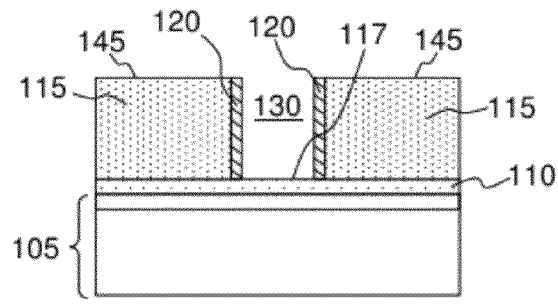
FIG. 1F is an illustration of the structure of FIG. 1E where the electrically conductive layer has been substantially and selectively removed, in accordance with embodiments of the present invention.

FIG. 1F is an illustration of the structure of FIG. 1E where the electrically conductive layer 120 has been substantially and selectively removed from the surface 145 of the electrically insulating layer 115 and from the portion of the surface of the silicide layer 110 at the bottom 117 of the via 130, where the portion of the silicide layer 110 at the bottom 117 may be exposed after the removing. The electrically conductive layer 120 may remain on the at least one side wall (140 in FIG. 1D) after the removing.

The electrically conductive layer 120 may be selectively removed using processes such as sputtering, for example argon sputtering. Removing the electrically conducting layer 120 may comprise etching selectively the electrically conductive layer 120 from the silicide layer 110 and from the surface 145 of the electrically insulating layer 115. Those skilled in the art will recognize other removal methods which may selectively remove the electrically conductive layer 120 from the surface 145 and the portion of silicide layer 110 at the bottom 117 of the via 130, where such methods are intended to be included within the scope of the present invention.

Figure 1G:
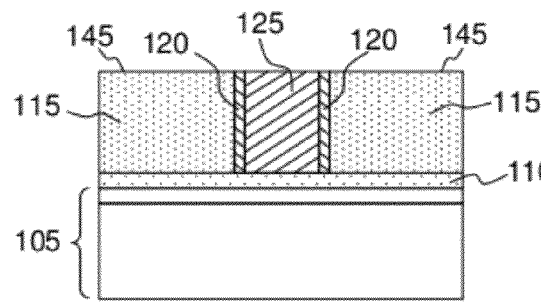
FIG. 1G is an illustration of a layered structure which may be formed by filling the via of FIG. 1F, in accordance with embodiments of the present invention.

FIG. 1G is an illustration of a layered structure 100 which may be formed by filling the via 130 of FIG. 1F. The via 130 of FIG. F may be filled with aluminum forming an aluminum plug 125 or column, where the aluminum plug 125 may directly contact the portion of the surface of the silicide layer 110 defining the bottom 117 of the via 130. At film thicknesses of 25 nm, the electrical resistivity of aluminum is approximately equivalent to that of copper, whereas for films thinner than about 25 nm the resistivity of aluminum is significantly lower than that of copper. For example, calculated electrical resistivities of 5 nm films of copper and aluminum are approximately 14.96 μΩ-cm and 10.69 μΩ-cm, respectively. Thus, the contact structures described herein using aluminum provides superior conductivity over analogous copper structures. In addition, a structure employing a barrier layer or liner disposed between the aluminum plug 125 and the silicide layer 110 would suffer from increased electrical resistance due to the added layer and interfacial resistance The layered structure 100 may comprise the silicide layer 110 disposed on the surface of the substrate 105, the electrically insulating layer 115 having a surface 145 and being disposed over the surface of the silicide layer 110, an aluminum plug 125 extending from the surface 145 of the electrically insulating layer 115 through the electrically insulating layer 115 to the surface of the silicide layer 110, where the plug 125 may directly contact the silicide layer 110, and an electrically conductive layer 120 disposed between the aluminum plug 125 and the electrically insulating layer 115.

Filling the via 130 may comprise a process such as chemical vapor deposition, physical vapor deposition, or a combination of these. For example, the via 130 may be filled by chemical vapor deposition of dimethylaluminum hydride, methylpyrroridine alane, or a combination thereof.

Figure 2:
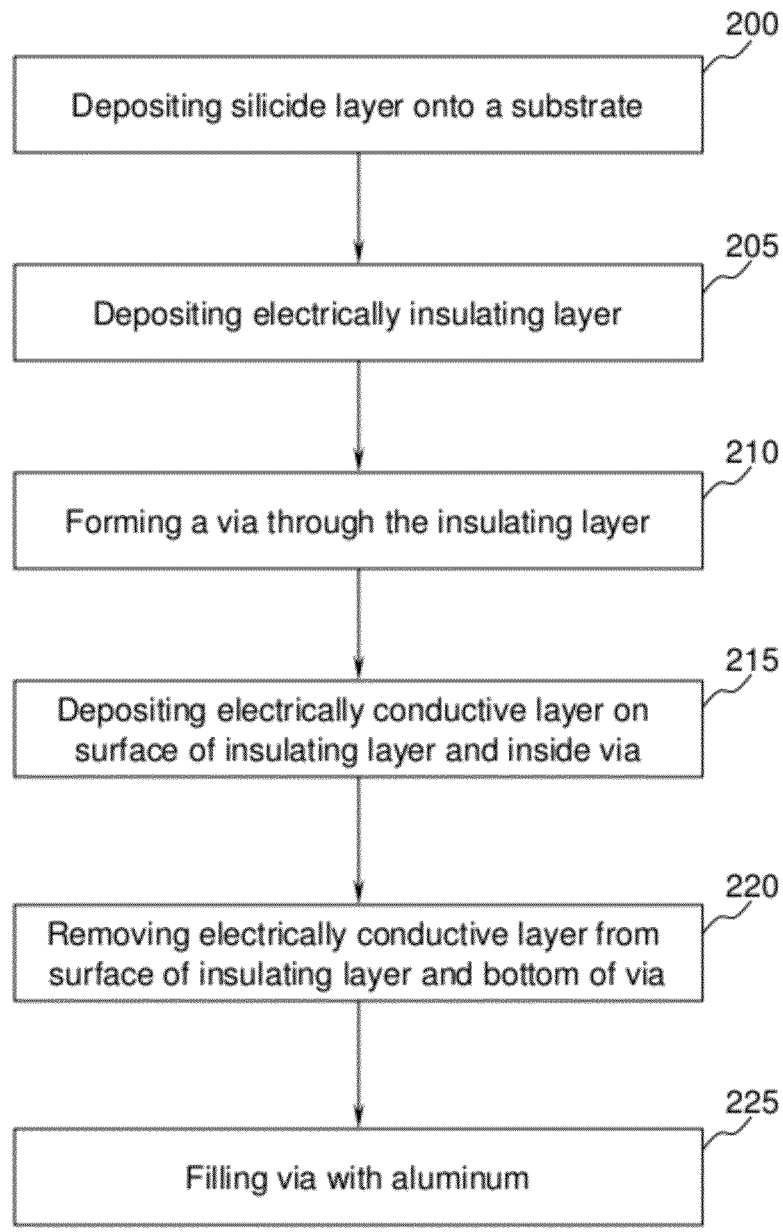
FIG. 2 is a flow chart illustrating steps for a method of forming contact structures, in accordance with embodiments of the present invention.

FIG. 2 is a flow chart illustrating steps for a method of forming contact structures. In step 200 a silicide layer is deposited onto a substrate. The substrate may be as that described above and illustrated in FIG. 1A, for example. The silicide layer may comprise a material such as NiPt, NiPtRe, NiSi, $CoSi_2$, YtSi, ErSi, $TiSi_2$, tungsten silicides, or combinations thereof, such as that described above and illustrated in FIGS. 1B, 1C, 1D, 1E, 1F, and 1G.

In step 205 an electrically insulating layer is deposited on a surface of the silicide layer deposited in step 200, such as is described above and illustrated in FIGS. 1C, 1D, 1E, 1F, and 1G.

In step 210, a via is formed through the insulating layer. The via may extend from the surface of the electrically insulating layer to the surface of the silicide layer, such as that illustrated in FIGS. 1D, 1E, and 1F. Forming the via may expose a portion of the surface of the silicide layer, where the via may have a bottom defined by the exposed portion of the surface of the silicide layer. The via may have at least one vertical sidewall.

In step 215, an electrically conductive layer is deposited onto the surface of the electrically insulating layer and inside the via formed in step 210, such as that illustrated in FIG. 1E and as described above. The electrically conductive layer may conformally and substantially cover the surface of the electrically insulating layer, the at least one side wall of the via and the bottom of the via.

In step 220, the conductive layer is selectively removed from the bottom of the via and from the surface of the insulating layer, such as described above and illustrated in FIG. 1F. The conductive layer may remain on the at least one sidewalls after the conductive layer is removed from the bottom of the via and the surface of the insulating layer. Removing the conductive layer from the bottom of the via may expose a surface of the silicide layer.

In step 225, the via is filled with aluminum where the aluminum may directly contact the surface of the silicide layer on the bottom of the via. The via may be filled using methods described above and illustrated in FIG. 1G.

Figure 3A:
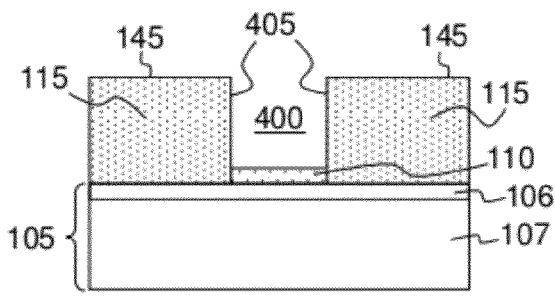
FIG. 3A is an illustration of a substrate having an electrically insulating layer disposed thereon, in accordance with embodiments of the present invention.

FIG. 3A is an illustration of a substrate 105 having an electrically insulating layer 115 disposed thereon. The substrate 115 may comprise materials described above and may comprise a plurality of layers such as layers 106 and 107 illustrated in the example of FIG. 3A, or the substrate 105 may comprise a single layer. The electrically insulating layer 115 may have a surface 145 and at least one trench 400, where the trench 400 may extend from the surface 145 of the insulating layer 115 to a bottom having a silicide layer 110 disposed thereon. The trench 400 may be defined by at least one sidewall 405 and the bottom having the silicide layer 110.

Figure 3B:
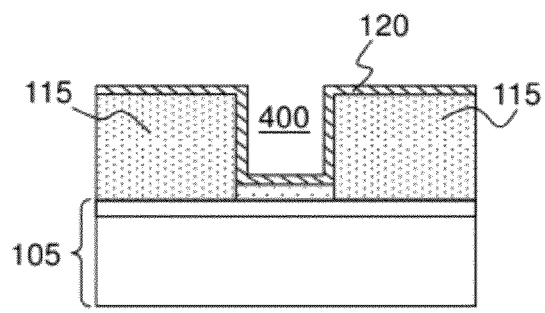
FIG. 3B is an illustration of an electrically conductive layer deposited into the at least one trench of FIG. 3A, in accordance with embodiments of the present invention.

FIG. 3B is an illustration of an electrically conductive layer 120 deposited into the at least one trench 400 of FIG. 3A. The electrically conductive layer 120 may adhere to the silicide layer 110, the at least one sidewall 405, and the surface 145 of the insulating layer 115.

Figure 3C:
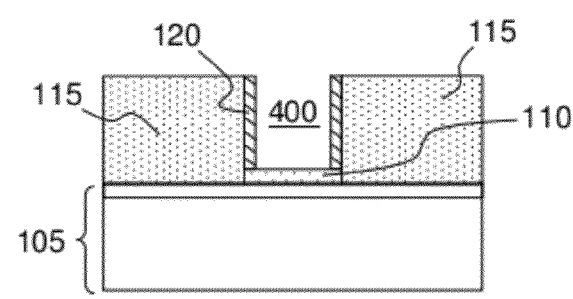
FIG. 3C is an illustration of the electrically conductive layer of FIG. 3B after it has been selectively etched from the silicide layer and the surface of the insulating layer, in accordance with embodiments of the present invention.

FIG. 3C is an illustration of the electrically conductive layer 120 of FIG. 3B after it has been selectively etched from the silicide layer 110 and the surface of the insulating layer 115.

Figure 3D:
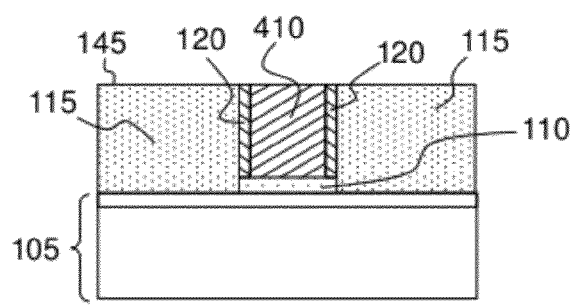
FIG. 3D is an illustration of FIG. 3C after depositing aluminum into the at least one trench, in accordance with embodiments of the present invention.

FIG. 3D is an illustration of FIG. 3C after depositing aluminum 410 into the at least one trench 400. As the aluminum 410 is deposited into the trench 400, an aluminum layer may selectively grow from the electrically conductive layer 120 on the at least one sidewall 405 of the trench 400 and from the silicide layer 110 on the bottom of the trench 400. The aluminum 410 may be in direct contact with the silicide layer 110.

Figure 4:
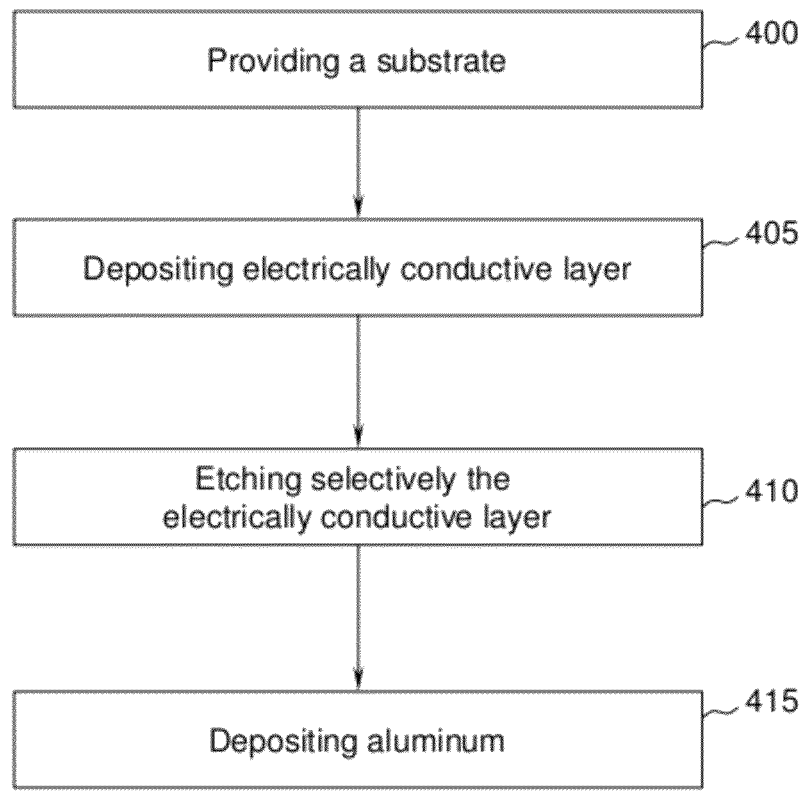
FIG. 4 is a flow chart illustrating a method for forming a contact structure, in accordance with embodiments of the present invention.

FIG. 4 is a flow chart illustrating a method for forming a contact structure. Step 400 provides a substrate, such as that described above and illustrated in FIG. 3A and FIG. 1D. The substrate may have an electrically insulating layer disposed thereon. The electrically insulating layer may have a surface and at least one trench, where the trench may extend from the surface of the insulating layer to a bottom having a silicide layer disposed thereon. The trench may be defined by at least one sidewall and the bottom having the silicide layer.

In step 405, an electrically conductive layer is deposited into the at least one trench, where the conductive layer may adhere to the silicide layer, the at least one side wall of the trench, and to the surface of the electrically insulating layer, such as the examples illustrated in FIG. 1E and FIG. 3B.

In step 410, the electrically conductively layer may be selectively etched from the silicide layer and the surface of the electrically insulating layer, where the surface of the silicide layer may be exposed after the selective etching. The etching may be a dry etching process such as plasma etching, plasma sputtering, reactive ion etching, combinations of theses, and the like. The electrically conductive layer may remain on the at least one side wall of the at least one trench after the selective etching, such as the examples illustrated in FIG. 1F and FIG. 3C.

In step 415, aluminum is deposited into the at least one trench. As the aluminum is deposited, an aluminum layer may grow selectively from the electrically conductive layer on the at least one sidewall and from the silicide layer on the bottom of the at least one trench. The aluminum may be in direct contact with the silicide layer, such as is illustrated in the examples in FIG. 1G and FIG. 3D. The electrically conductive layer and the silicide layer may provide preferred nucleation sites for the aluminum. For example, the substrate may be a semiconductor process wafer, where after aluminum deposition in a trench and selective film growth, the wafer may not require additional chemical mechanical polishing since aluminum may not form on the electrically insulating surface. In addition, hot reflow of aluminum may not be required since the aluminum deposition may substantially fill the trench.

The foregoing description of the embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed:

1. A contact structure, comprising:
   a silicide layer on and in direct physical contact with a top substrate surface of a substrate;
   an electrically insulating layer on the substrate; and
   an aluminum plug within the insulating layer, said aluminum plug having a thickness not exceeding 25 nanometers in a direction perpendicular to the top substrate surface, said aluminum plug extending in said direction from a top surface of the silicide layer to a top surface of the insulating layer, said aluminum plug being in direct physical contact with the top surface of the silicide layer and being in direct physical contact with the silicide layer.

2. The structure of claim 1, wherein the insulating layer is in direct physical contact with the top surface of the silicide layer, and wherein the insulating layer is separated from the top substrate surface by the silicide layer.

3. The structure of claim 1, wherein the insulating layer is in direct physical contact with a side surface of the silicide layer that is perpendicular to the top surface of the silicide layer, and wherein the insulating layer is in direct physical contact with the top substrate surface.

4. The structure of claim 1, further comprising an electrically conductive layer in an opening in the insulating layer and in direct physical contact with at least one vertical wall bounding the opening, said opening being a via or a trench, said aluminum plug being totally within the opening, said aluminum plug being surrounded by and in direct physical contact with the conductive layer.

5. The structure of claim 4, wherein the opening is said via, and wherein all of the silicide layer is external to the via.

6. The structure of claim 4, wherein the opening is said trench, and wherein all of the silicide layer is in the trench.

7. The structure of claim 1, wherein the thickness of the aluminum plug is 25 nanometers.

8. The structure of claim 1, wherein the thickness of the aluminum plug is less than 25 nanometers.

9. The structure of claim 1, wherein the silicide layer comprises YtSi.

10. The structure of claim 1, wherein the silicide layer comprises ErSi.

11. A method for forming a contact structure, said method comprising:
  forming a silicide layer on and in direct physical contact with a top substrate surface of a substrate;
  forming an electrically insulating layer on the substrate; and
  forming an aluminum plug within the insulating layer, said aluminum plug having a thickness not exceeding 25 nanometers in a direction perpendicular to the top substrate surface, said aluminum plug extending in said direction from the top surface of the silicide layer to a top surface of the insulating layer, said aluminum plug being in direct physical contact with a top surface of the silicide layer, said insulating layer being in direct physical contact with the silicide layer after said forming the aluminum plug.

12. The method of claim 11, wherein said forming the insulating layer is performed after said forming the silicide layer is performed, wherein said forming the insulating layer results in the insulating layer being in direct physical contact with the top surface of the silicide layer and further results in the insulating layer being separated from the top substrate surface by the silicide layer.

13. The method of claim 11, wherein said forming the silicide layer is performed after said forming the insulating layer is performed, wherein said forming the insulating layer and said forming the silicide layer results in the insulating layer being in direct physical contact with a side surface of the silicide layer that is perpendicular to the top surface of the silicide layer and further results in the insulating layer being in direct physical contact with the top substrate surface.

14. The method of claim 11, comprising
  forming an opening in the insulating layer, said opening being a via or a trench; and
  forming an electrically conductive layer in the opening and in direct physical contact with at least one vertical wall bounding the opening,
  wherein said forming the aluminum plug is performed after said forming the electrically conductive layer is performed, said forming the aluminum plug comprising forming the aluminum plug totally within the opening such that the aluminum plug is surrounded by and in direct physical contact with the conductive layer.

15. The method of claim 14, wherein said forming the electrically conductive layer in the opening comprises:
  forming the electrically conductive layer on the top surface of the insulating layer, on the at least one vertical wall bounding the opening, and in a bottom of the via on the top surface of the silicide layer; and
  removing a portion of the conductive layer from the top surface of the insulating layer and from the bottom of the via, resulting in the conductive layer remaining only on the at least one vertical wall.

16. The method of claim 14, wherein the opening is said via, and wherein all of the silicide layer is external to the via.

17. The method of claim 14, wherein the opening is said trench, and wherein all of the silicide layer is in the trench.

18. The method of claim 11, wherein the thickness of the aluminum plug is 25 nanometers.

19. The method of claim 11, wherein the thickness of the aluminum plug is less than 25 nanometers.

20. The method of claim 11, wherein the silicide layer comprises YtSi or ErSi.

* * * * *